United States Patent
Lee et al.

(10) Patent No.: US 11,638,363 B2
(45) Date of Patent: Apr. 25, 2023

(54) CLOTHES DRYER

(71) Applicant: Samsung Electronics Co., Ltd., Suwon-si (KR)

(72) Inventors: Dongbum Lee, Suwon-si (KR); Kyoungwoong Noh, Suwon-si (KR); Eungryeol Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 383 days.

(21) Appl. No.: 17/112,816

(22) Filed: Dec. 4, 2020

(65) Prior Publication Data

US 2021/0176891 A1    Jun. 10, 2021

(30) Foreign Application Priority Data

Dec. 5, 2019 (KR) .......................... 10-2019-0161016

(51) Int. Cl.
| | | |
|---|---|---|
| H05K 7/20 | (2006.01) | |
| D06F 58/20 | (2006.01) | |
| D06F 34/08 | (2020.01) | |
| D06F 58/02 | (2006.01) | |

(52) U.S. Cl.
CPC ......... *H05K 7/20145* (2013.01); *D06F 34/08* (2020.02); *D06F 58/20* (2013.01); *D06F 58/206* (2013.01); *D06F 58/02* (2013.01)

(58) Field of Classification Search
CPC ........ D06F 34/08; D06F 58/20; D06F 58/206; D06F 58/02; H05K 7/20145
See application file for complete search history.

(56) References Cited

U.S. PATENT DOCUMENTS

| | | | | |
|---|---|---|---|---|
| 2014/0208609 | A1* | 7/2014 | Han | ........................ D06F 25/00 |
| | | | | 34/130 |
| 2020/0048820 | A1* | 2/2020 | Lee | ........................ D06F 34/08 |

FOREIGN PATENT DOCUMENTS

| | | |
|---|---|---|
| JP | 2005-224490 A | 8/2005 |
| JP | 2014-023747 A | 2/2014 |
| KR | 10-2001-0011098 A | 2/2001 |
| KR | 10-2001-0075940 A | 8/2001 |
| KR | 10-2001-0075941 A | 8/2001 |
| KR | 10-2010-0082471 A | 7/2010 |
| KR | 10-2019-0016864 A | 2/2019 |
| KR | 10-2019-0102821 A | 9/2019 |
| KR | 10-2019-0128491 A | 11/2019 |

OTHER PUBLICATIONS

International Search Report dated Apr. 9, 2021 in connection with International Patent Application No. PCT/KR2020/017509, 2 pages.

* cited by examiner

*Primary Examiner* — Jessica Yuen

(57) ABSTRACT

A clothes dryer with improved heat dissipation efficiency of electronic components. The clothes dryer includes a cabinet having a clothes inlet, a drum rotatably provided in the cabinet, a drying fan configured to circulate air for drying supplied to the drum, and a heat dissipation duct. Wherein the heat dissipation plate includes a lower case fixed to the cabinet and provided with an airflow guide portion protruding toward the printed circuit board and an upper case coupled to an upper portion of the lower case and to which a printed circuit board on which a plurality of electronic components is mounted is fixed.

20 Claims, 6 Drawing Sheets

CLOTHES DRYER

CROSS-REFERENCE TO RELATED APPLICATION

This application is based on and claims priority under 35 U.S.C. § 119 to Korean Patent Application No. 10-2019-0161016, filed on Dec. 5, 2019, in the Korean Intellectual Property Office, the disclosure of which is incorporated by reference herein in its entirety.

BACKGROUND

1. Field

The disclosure relates to a clothes dryer, and more particularly, to a clothes dryer with improved heat dissipation efficiency of electronic components.

2. Description of the Related Art

In general, clothes dryers may be classified into an air-vent type, a condenser type, and a heat pump type. The heat pump-type clothes dryer may include a heat pump system including a compressor, a condenser, an expansion valve, and an evaporator to heat air, and an air circulation system including a drying fan to supply air that has become hot by heat exchange with the condenser to a drum in which laundry is accommodated.

A control device for electronically controlling these systems may be provided. The control device may include a printed circuit board on which a plurality of electronic components is mounted, and thus heat generated from the electronic components needs to be dissipated. In addition, the control device needs to be protected from the influence of heat generated from the drum of a high temperature and the like.

SUMMARY

It is an aspect of the disclosure to provide a clothes dryer provided with a heat dissipation duct to effectively dissipate heat generated from a printed circuit board.

It is another aspect of the disclosure to provide a clothes dryer capable of easily separating a heat dissipation duct in which a printed circuit board is provided so that the printed circuit board may be easily repaired or replaced.

It is another aspect of the disclosure to provide a clothes dryer capable of minimizing the influence of heat generated from a heating element such as a drum by covering a printed circuit board with a heat dissipation duct.

Additional aspects of the disclosure will be set forth in part in the description which follows and, in part, will be obvious from the description, or may be learned by practice of the disclosure.

In accordance with an aspect of the disclosure, a clothes dryer includes a cabinet having a clothes inlet, a drum rotatably provided in the cabinet, a drying fan configured to circulate air for drying supplied to the drum, and a heat dissipation duct including a lower case fixed to the cabinet and provided with an airflow guide portion protruding toward the printed circuit board, and an upper case coupled to an upper portion of the lower case and to which a printed circuit board on which a plurality of electronic components is mounted is fixed.

The printed circuit board may be fixed to the upper case such that the electronic components face the lower case.

The heat dissipation duct may include a heat dissipation passage formed between the lower case and the upper case, and the printed circuit board may be fixed to a lower surface of the upper case such that the printed circuit board is disposed on the heat dissipation passage.

The heat dissipation duct may further include a cooling fan coupled to the upper case to form an airflow in the heat dissipation passage.

The heat dissipation duct may be provided with an inlet through which air is introduced into the heat dissipation passage and an outlet through which air is discharged from the heat dissipation passage, and the cooling fan may be disposed such that one side thereof is be in communication with the inlet.

The heat dissipation duct may be coupled to the cabinet such that the inlet faces a front side of the cabinet and the outlet faces a rear side of the cabinet.

The lower case may include an inlet portion forming the inlet and an outlet portion forming the outlet, the airflow guide portion may be provided between the inlet portion and the outlet portion, the airflow guide portion may be located closest to the printed circuit board among the airflow guide portion, the outlet portion, and the inlet portion, and the airflow guide portion may include inclined portions connected to one end of the outlet portion and one end of the inlet portion, respectively.

The clothes dryer may further include a driving device configured to drive the drum and the drying fan; and a compressor, wherein the printed circuit board may include a driving device controller configured to control the driving device and a compressor controller configured to control the compressor.

The driving device controller and the compressor controller each may include an inverter circuit.

The driving device controller and the compressor controller each may include a heat sink to dissipate generated heat, and one surface of the lower case may protrude convexly toward the heat sinks.

The heat dissipation duct may be provided with an inlet through which air is introduced therein and an outlet through which air is discharged therefrom, the driving device controller may include a first heat sink, the compressor controller may include a second heat sink, and one heat sink having a higher amount of heat among the first heat sink and the second heat sink may be disposed closer to the inlet than the other heat sink.

The heat dissipation duct may further include a cooling fan provided to be in communication with the inlet, and the cooling fan may form an airflow to flow air from the inlet to the outlet and the airflow may pass through the heat sinks.

The driving device and the compressor may be disposed at a lower portion of the cabinet, and the heat dissipation duct may be disposed at an upper portion of the cabinet.

The lower case may include a plurality of fixing parts to be fixed to the cabinet, and the heat dissipation duct may be coupled to a front surface, a rear surface and one side surface of the cabinet by the plurality of fixing parts.

The clothes dryer may further include a fire protection plate provided between the lower case and the printed circuit board.

In accordance with another aspect of the disclosure, a clothes dryer includes a cabinet having a clothes inlet, a drum rotatably provided in the cabinet, a drying fan configured to circulate air for drying supplied to the drum, a driving device configured to drive the drum and the drying fan, a compressor disposed in the cabinet, a printed circuit board having one surface on which a driving device controller configured to control the driving device and a compressor controller configured to control the compressor are disposed, and a heat dissipation duct provided to dissipate heat generated from the printed circuit board, wherein the printed circuit board is disposed inside the heat dissipation duct such that the one surface on which the driving device controller and the compressor controller are disposed faces a lower surface of the cabinet.

The heat dissipation duct may include an upper case to which the printed circuit board is fixed and a lower case coupled to the upper case to cover the printed circuit board, and one surface of the lower case may protrude convexly toward the printed circuit board.

The heat dissipation duct may include a cooling fan and provided with an inlet through which air is introduced into the heat dissipation duct and an outlet through which air is discharged from the inside of the heat dissipation duct to the outside, and the heat dissipation duct may be disposed inside the cabinet such that the inlet faces a front side of the cabinet and the outlet faces a rear side of the cabinet.

The lower case may include an inlet portion forming the inlet, an outlet portion forming the outlet, and an airflow guide portion provided between the inlet portion and the outlet portion, the airflow guide portion may be located closest to the printed circuit board among the airflow guide portion, the outlet portion, and the inlet portion, and the airflow guide portion may include inclined portions connected to one end of the outlet portion and one end of the inlet portion, respectively.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Configurations shown in the embodiments and the drawings described in the present specification are only the preferred embodiments of the present disclosure, and thus it is to be understood that various modified examples, which may replace the embodiments and the drawings described in the present specification, are possible when filing the present application.

Like reference numbers or signs in the various figures of the application represent parts or components that perform substantially the same functions. In the drawings, shapes and sizes of elements may be exaggerated to facilitate understanding.

The terms used herein are for the purpose of describing the embodiments and are not intended to restrict and/or to limit the disclosure. For example, the singular expressions herein may include plural expressions, unless the context clearly dictates otherwise. Also, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that although the terms first, second, etc. may be used herein to describe various components, these components should not be limited by these terms, and the terms are only used to distinguish one component from another. For example, without departing from the scope of the disclosure, the first component may be referred to as a second component, and similarly, the second component may also be referred to as a first component. The term "and/or" includes any combination of a plurality of related items or any one of a plurality of related items.

The terms "front end," "rear end," "upper portion," "lower portion," "upper end" and "lower end" used in the following description are defined with reference to the drawings, and the shape and position of each component are not limited by these terms.

Hereinafter, embodiments of the disclosure will be described in detail with reference to the accompanying drawings.

Figure 1:
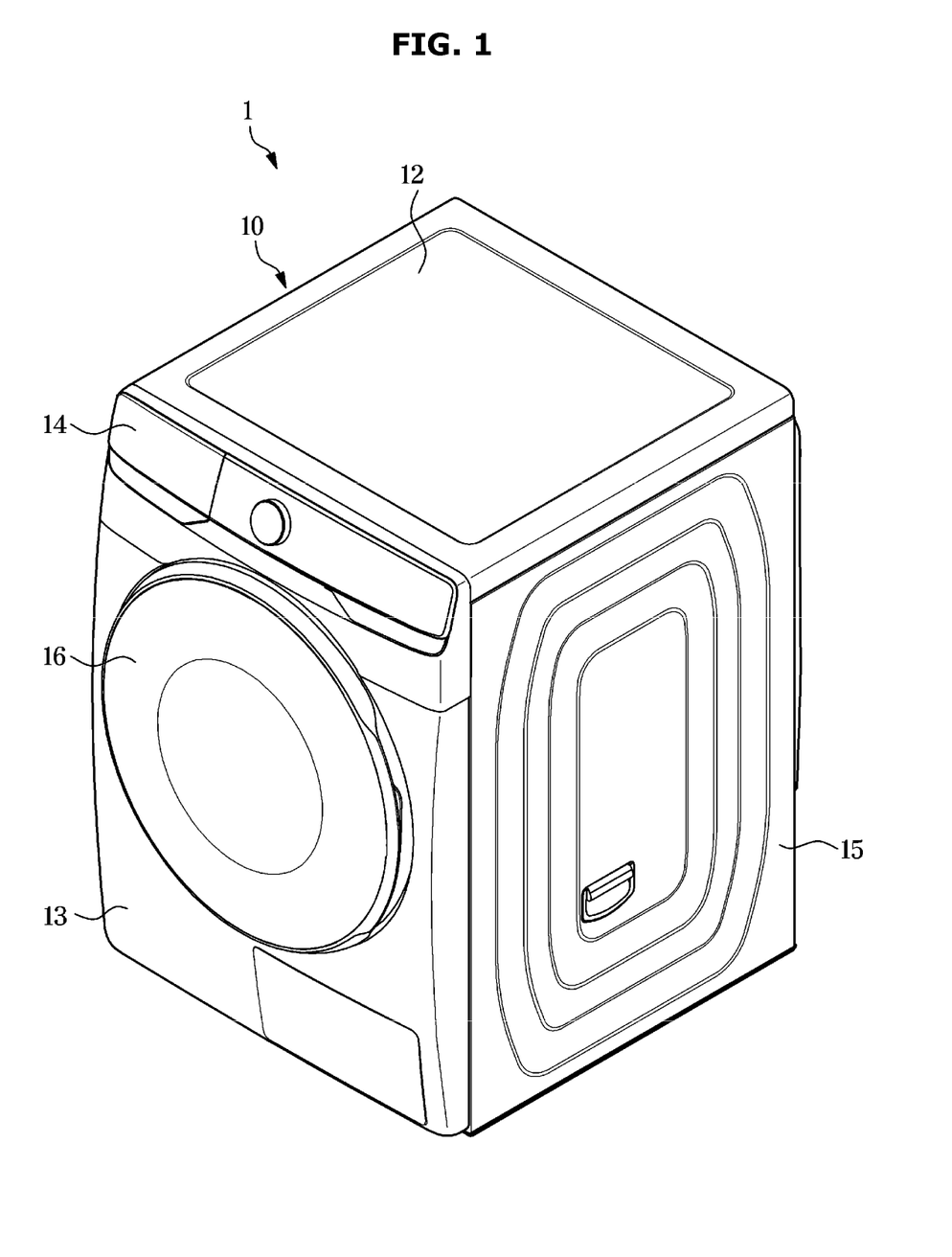
FIG. 1 is a perspective view of a clothes dryer according to an embodiment of the disclosure.
Figure 2:
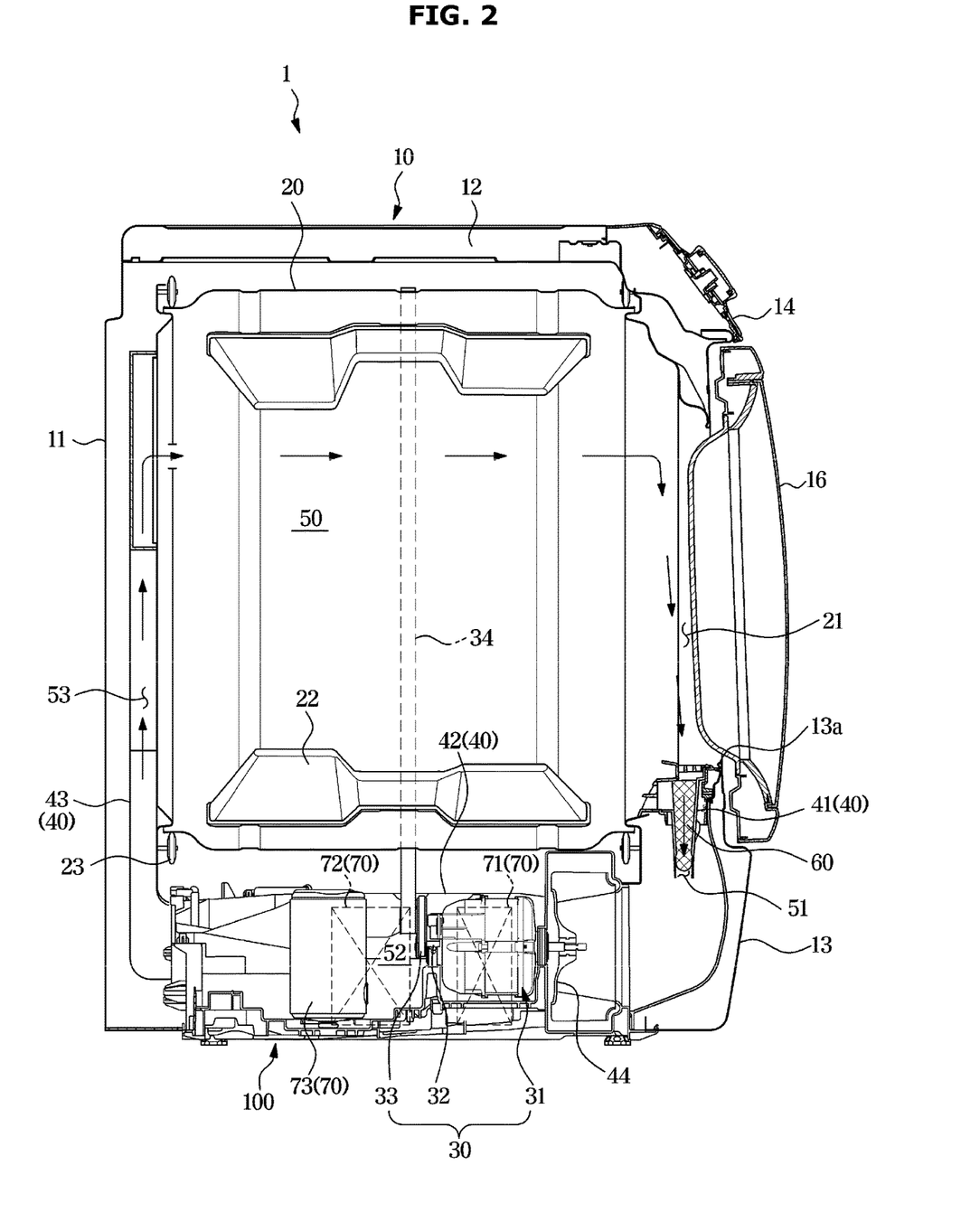
FIG. 2 is a cross-sectional view illustrating components of the clothes dryer of FIG. 1.

FIG. 1 is a perspective view of a clothes dryer according to an embodiment of the disclosure, and FIG. 2 is a cross-sectional view illustrating components of the clothes dryer of FIG. 1.

Referring to FIGS. 1 to 2, a clothes dryer 1 may include a cabinet 10 and a drum 20 rotatably provided in the cabinet 10.

The cabinet 10 may have a substantially box shape. Specifically, the cabinet 10 may have a top plate 12, a bottom plate 100, a front plate 13, a right plate 15, a left plate (not shown), and a rear plate 11. The cabinet 10 may be assembled by separately providing the top plate 12, the bottom plate 100, the front plate 13, the right plate 15, the left plate, and the rear plate 11, but is limited thereto, and all of the plates may be integrally formed, or at least some of the plates may be integrally formed.

The front plate 13 of the cabinet 10 may be provided with a clothes inlet 13a for inserting or withdrawing clothes, which is an object to be dried, into or from the drum 20. The clothes inlet 13a may be opened and closed by a door 16. A control panel 14 configured to control the operation of the clothes dryer 1 may be provided at an upper portion of the cabinet 10. The control panel 14 may form a portion of the front plate 13.

The drum 20 may be provided inside the cabinet 10 to accommodate an object to be dried. An opening 21 may be formed on a front surface of the drum 20 to correspond to the clothes inlet 13a. The opening 21 may also be opened and closed by the door 16. Inside the drum 20, a plurality of lifters 22 may be disposed along a circumferential direction of the drum 20. The lifter 22 may raise and drop the object to be dried so that the object to be dried may be effectively dried. A roller 23 supporting the drum 20 to rotate smoothly may be provided on an outer circumferential surface of the drum 20.

The clothes dryer 1 may include a driving device 30 configured to drive the drum 20. The driving device 30 may include a driving motor 31 mounted on the bottom plate 100. The driving motor 31 may include a pulley 33 and a belt 34. The pulley 33 may be connected to a rotation shaft 32 connected to the driving motor 31. When the rotation shaft 32 is rotated by the drive motor 31, the pulley 33 may be also rotated together with the rotation shaft 32. The belt 34 may transmit the rotation of the pulley 33 to the drum 20 by connecting the pulley 33 and the drum 20.

The clothes dryer 1 may circulate air to dry the object to be dried inside the drum 20. The cabinet 10 may include a duct 40 to form a circulation passage for removing humid air inside the drum 20 from the drum 20 and supplying dry air to the drum 20.

The duct 40 may include an inlet duct 41 for introducing humid air inside the drum 20 into the duct 40, an outlet duct 43 for discharging hot air to the drum 20, and a connection duct 42 connecting the inlet duct 41 and the outlet duct 43.

A circulation passage 50 through which air in the duct 40 flows may be formed. The circulation passage 50 may include an inlet passage 51, a connection passage 52, and an outlet passage 53. The inlet passage 51 may be formed by the inlet duct 41 through which air that has passed through the inside of the drum 20 is introduced. The connection passage 52 may be connected to the outlet passage 53. The connection passage 52 may be formed by the connection duct 42 connecting the inlet duct 41 and the outlet duct 43. The outlet passage 53 may be connected to the connection passage 52. The outlet passage 53 may be formed by the outlet duct 43 through which hot air is discharged to the drum 20.

The inlet duct 41 may be disposed at a front lower of the drum 20. The outlet duct 43 may be disposed at the rear of the drum 20. The connection duct 42 may be disposed below the drum 20. The connection duct 42 may be installed on the bottom plate 100.

The outlet duct 43 is disposed at the rear of the drum 20 so that hot dry air may be supplied into the drum 20 through the outlet duct 43. The object to be dried inside the drum 20 may be dried by the hot dry air. The air that has dried the object to be dried may become hot and humid, The hot and humid air in the drum 20 may be discharged below the drum 20 through the inlet duct 41.

A filter 60 may be installed in the inlet duct 41. The filter 60 may filter out foreign substances such as lint contained in the air passed through the drum 20. The air filtered by the filter 60 may be discharged into the drum 20 through the connection duct 42 and the outlet duct 43.

The hot and humid air in the drum 20 is introduced into heat exchangers 71 and 72 along the inlet passage 51 in the inlet duct 41. The air that has become hot and dry by passing through the heat exchangers 71 and 72 may be circulated by being discharged into the drum 20 along the outlet passage 53 again. This circulation of air may be derived by a drying fan 44 installed on the inlet passage 51 side.

The clothes dryer 1 may include the drying fan 44. The drying fan 44 may generate a circulation airflow in which the hot and humid air in the drum 20 is introduced into the circulation passage 50 and the hot dry air passed through the heat exchangers 71 and 72 is discharged into the drum 20. The drying fan 44 may be driven together by the driving motor 31 driving the drum 20. However, the disclosure is not limited thereto.

The clothes dryer 1 may include the bottom plate 100, and the bottom plate 100 forms a lower portion of the drum 20 and may accommodate various devices.

The heat exchanger 71 and 72, a dehumidification unit 70, and the drying fan 44 may be provided in a lower portion of the cabinet 10. The heat exchanger 71 and 72, the dehumidification unit 70, and the drying fan 44 may be disposed on the bottom plate 100. The heat exchanger 71 and 72, the dehumidification unit 70, and the drying fan 44 may be disposed between the bottom plate 100 and the drum 20.

The dehumidification unit 70 may include the evaporator 71, the condenser 72, and a compressor 73. The heat exchangers 71 and 72 may include the evaporator 71 and the condenser 72. Also, although not shown, an expansion valve may be further included.

The hot and humid air discharged from the drum 20 is introduced into the heat exchangers 71 and 72 through the drying fan 44. The hot and humid air may first pass through the evaporator 71 of the dehumidification unit 70. A refrigerant that absorbs heat by expansion due to a pressure drop may flow inside the evaporator 71. The refrigerant absorbs heat while evaporating in the evaporator 71, and the hot and humid air passing through the evaporator 71 loses moisture while being cooled and becomes cold and dry air. That is, the hot and humid air discharged from the drum 20 is changed into cold and dry air while passing through the evaporator 71. Moisture escaped from the dehumidified air may be stored in a drain container 110 (see FIG. 3) provided inside the cabinet 10.

Figure 3:
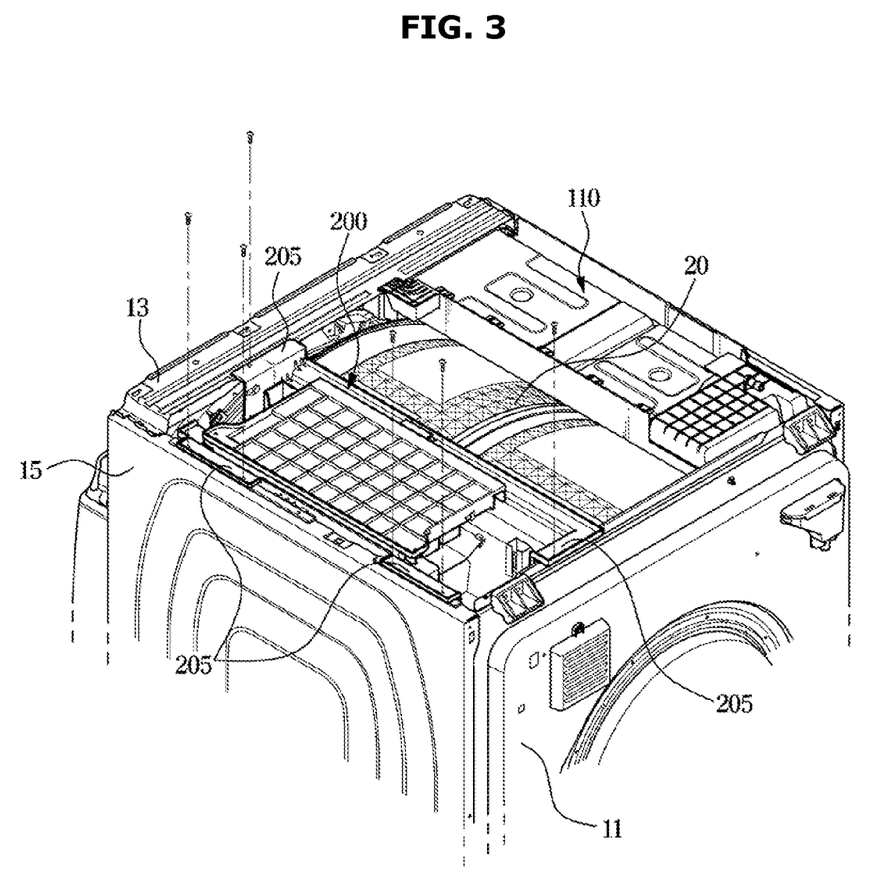
FIG. 3 illustrates a state in which a top plate is removed from the clothes dryer of FIG. 1.

The drain container 110 may be disposed at the upper portion of the cabinet 10. The drain container 110 may be provided in a space between the cabinet 10 and the drum 20.

The cold and dry air passed through the evaporator 71 may pass through the condenser 72. The refrigerant overheated by being compressed by the compressor 73 may flow inside the condenser 72. The overheated refrigerant releases heat while flowing through the condenser 72, and the cold and dry air passing through the condenser 72 become hot and dry air by being heated. That is, the cold and dry air passed through the evaporator 71 is changed into hot and dry air while passing through the condenser 72.

When a drying process starts, the driving motor 31 operates, and the drum 20 and the drying fan 44 is operated by the operation of the driving motor 31. The drying fan 44 generates an airflow. The air is changed into hot and dry air while passing through the evaporator 71 and the condenser 72 and may be introduced into the drum 20. The hot and thy air introduced into the drum 20 deprives moisture from an object to be dried accommodated in the drum 20 to dry the object. At the same time, the air is changed into hot and humid air. The hot and humid air may be introduced into the heat exchangers 71 and 72 again along the inlet passage 51 to be changed into hot and dry air. This hot and dry air may be discharged to the drum 20 again.

Figure 4:
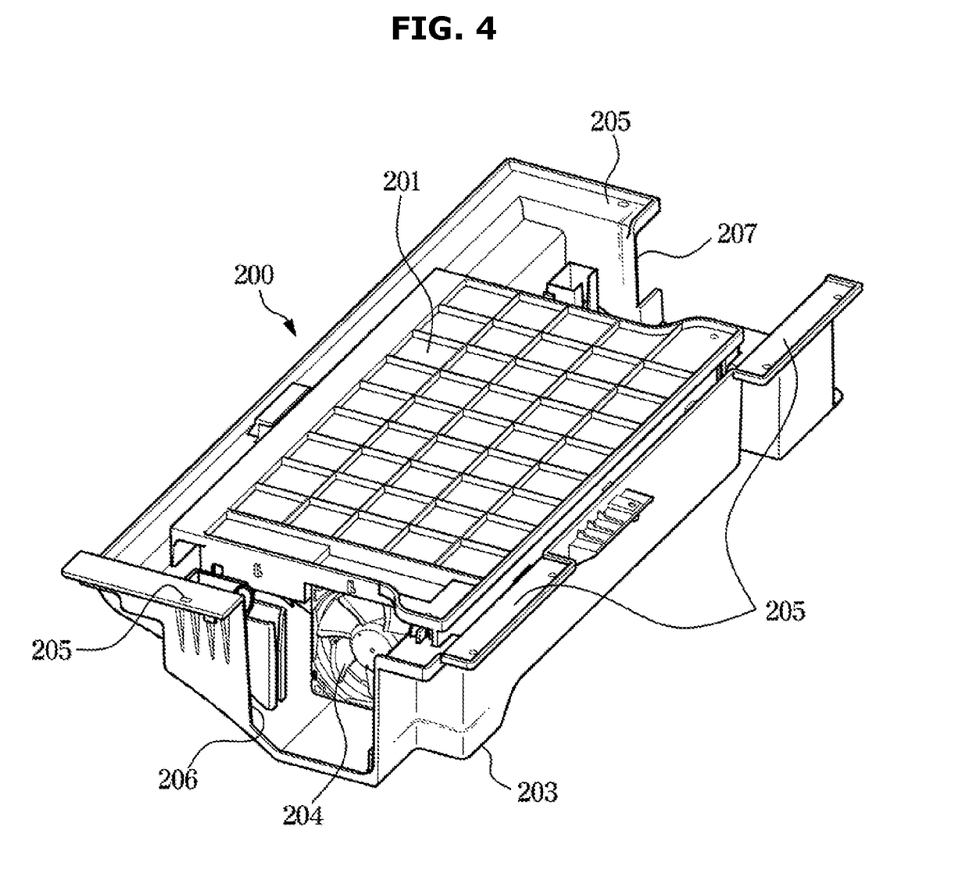
FIG. 4 illustrates a heat dissipation duct in the clothes dryer of FIG. 1.
Figure 5:
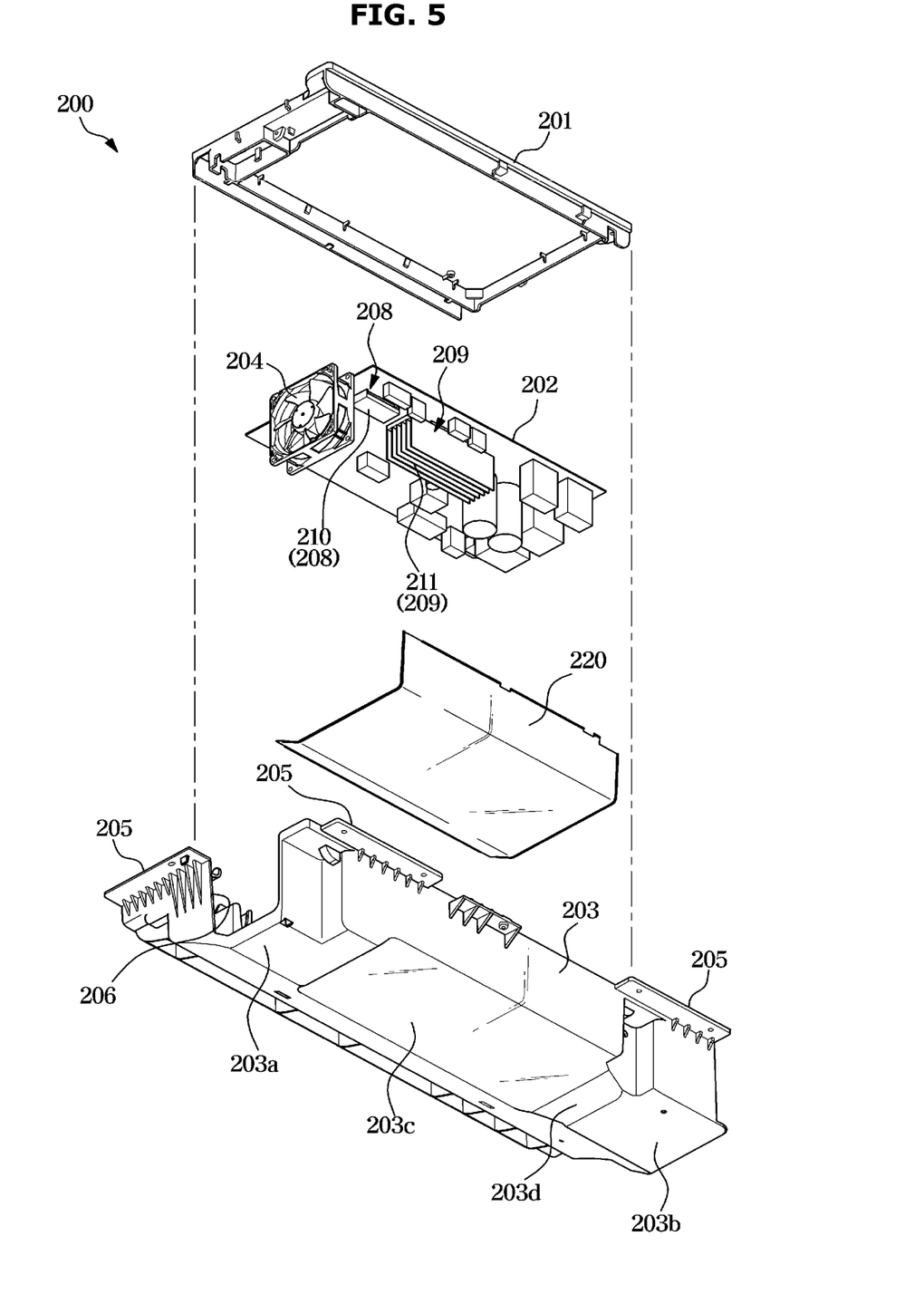
FIG. 5 is an exploded perspective view of the heat dissipation duct of FIG. 4.
Figure 6:
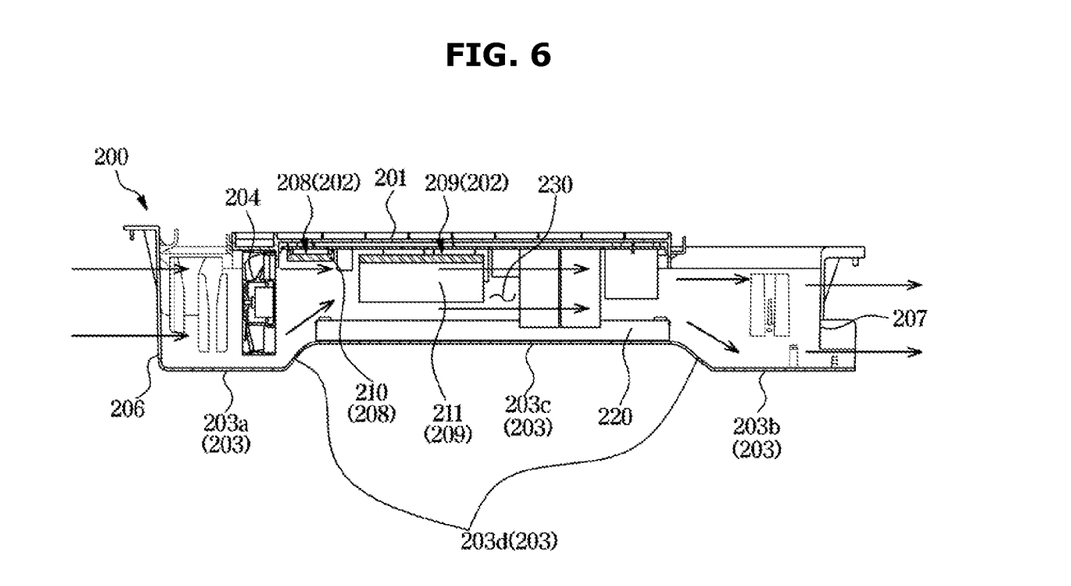
FIG. 6 is a side cross-sectional view of the heat dissipation duct of FIG. 4, showing the flow of air.

FIG. 3 illustrates a state in which a top plate is removed from the clothes dryer of FIG. 1, FIG. 4 illustrates a heat dissipation duct in the clothes dryer of FIG. 1, FIG. 5 is an exploded perspective view of the heat dissipation duct of FIG. 4, and FIG. 6 is a side cross-sectional view of the heat dissipation duct of FIG. 4, showing the flow of air.

Referring to FIGS. 3 to 6, the clothes dryer 1 may include a printed circuit board 202 configured to control the drum 20, the drying fan 44, the compressor 73, and the like. The printed circuit board 202 may be provided inside a heat dissipation duct 200 provided at the upper portion of the cabinet 10.

A plurality of electronic components may be mounted on one surface of the printed circuit board 202, The printed circuit board 202 may include a driving device controller 208 composed of electronic components to control the driving motor 31 driving the drum 20 and the drying fan 44, and a compressor controller 209 composed of electronic components to control the compressor 73. The driving device controller 208 and the compressor controller 209 may each include an inverter circuit. However, the disclosure is not limited thereto, and the printed circuit board 202 may include a plurality of other circuits and electronic components necessary to normally drive the clothes dryer 1.

The printed circuit board 202 may include a plurality of heat sinks 210 and 211. Specifically, the printed circuit board 202 may include the first heat sink 210 configured to dissipate heat generated from the driving device controller 208, and the second heat sink 211 configured to dissipate heat generated from the compressor controller 209. However, the disclosure is not limited thereto, and an additional heat sink may be provided. The first and second heat sinks 210 and 211 may be disposed on the printed circuit board 202 to be biased toward a side surface of the heat dissipation duct 200.

The clothes dryer 1 may include the heat dissipation duct 200 to dissipate heat generated from the printed circuit board 202.

The heat dissipation duct 200 may have a heat dissipation passage 230 formed therein, and the printed circuit board 202 may be disposed on the heat dissipation passage 230. The heat dissipation duct 200 may include a cooling fan 204 to form an airflow in the heat dissipation passage 230.

The heat dissipation duct 200 may include an inlet 206 through which air is introduced into the heat dissipation passage 230 and an outlet 207 through which air is discharged from the heat dissipation passage 230, and the heat dissipation passage 230 may be in communication with the inlet 206 and the outlet 207. The heat dissipation duct 200 may be disposed such that the inlet 206 faces the front plate 13 of the cabinet 10 and the outlet 207 faces the rear plate 11 of the cabinet 10. However, the disclosure is not limited thereto, and the heat dissipation duct 200 may be disposed such that the inlet 206 faces the rear plate 11 and the outlet 207 faces the front plate 13.

The cooling fan 204 may be provided such that one side thereof is in communication with the inlet 206. Air introduced through the inlet 206 may dissipate heat generated from the printed circuit board 202 while flowing through the heat dissipation passage 230 and may be discharged from the heat dissipation passage 230 through the outlet 207. However, the disclosure is not limited thereto, and the cooling fan 204 may be disposed close to the outlet 207 such that one side thereof is in communication with the outlet 207.

The cooling fan 204 may include a blowing fan. However, the disclosure is not limited thereto, and the cooling fan 204 may include a suction fan.

The cooling fan 204 may be coupled to an upper case 201. However, the disclosure is not limited thereto, and the cooling fan 204 may be coupled to a lower case 203 or may be coupled to the printed circuit board 202.

On the printed circuit board 202, the first heat sink 210 of the driving device controller 208 may have a smaller size than the second heat sink 211 of the compressor controller 209. The first heat sink 210 may be disposed closer to the inlet 206 than the second heat sink 211. Accordingly, contact of the first heat sink 210 with the airflow inside the heat dissipation passage 230 by being covered by the second heat sink 211 may not be disturbed.

However, the disclosure is not limited thereto. For example, when the amount of heat generated by the second heat sink 211 of the compressor controller 209 is relatively larger than that of the first heat sink 210, the second heat sink 211 may be disposed closer to the inlet 206 than the first heat sink 210 to first contact the airflow introduced from the inlet 206. That is, one heat sink having a higher amount of heat among the first heat sink 210 and the second heat sink 211 may be disposed closer to the inlet 206, through which air is introduced from the outside of the heat dissipation duct 200, than the other heat sink.

The heat dissipation duct 200 may include the lower case 203 forming a lower portion of the heat dissipation duct 200 and the upper case 201 forming an upper portion of the heat dissipation duct 200.

The upper case 201 may be formed in a flat plate shape. The upper case 201 may be coupled to an upper portion of the lower case 203.

The printed circuit board 202 may be coupled to one surface of the upper case 201. Specifically, the printed circuit board 202 may be fixed to a lower surface of the upper case 201 so that one surface of the printed circuit board 202 on which the plurality of electronic components is mounted faces downward. That is, the printed circuit board 202 may be coupled to one surface of the upper case 201 so that the electronic components mounted on the printed circuit board 202 face the lower case 203.

When the clothes dryer 1 is viewed from the front of the clothes dryer 1, the cylindrical drum 20 is disposed inside the box-shaped cabinet 10. Accordingly, as a distance in the upward or downward direction from a diameter of the drum 20 parallel to the bottom plate 100 increases, a distance between the drum 20 and the side plate 15 increases.

When the printed circuit board 202 is disposed in the cabinet 10 such that the mounted electronic components face the bottom of the clothes dryer 1, the printed circuit board 202 may be further away from the drum 20 upwards than when the printed circuit board 202 is disposed at the same position in the cabinet 10 such that the electronic components face the top of the clothes dryer 1. Therefore, a wider space may be utilized to dispose the printed circuit board 202.

The printed circuit board 202 may be coupled to the lower surface of the upper case 201 using screws, adhesives, etc., but is not limited thereto, and other means for coupling the printed circuit board 202 to the lower surface of the upper case 201 may be provided.

The lower case 203 may have a space therein to cover the printed circuit board 202 and may be coupled to the upper case 201. The upper case 201 coupled to the lower case 203 may partially cover the space inside the lower case 203. However, the disclosure is not limited thereto, and the upper case 201 may be formed to cover the entire space inside the lower case 203. The lower case 203 may be formed of a flame retardant material.

The heat dissipation passage 230 may include a space between the lower case 203 and the upper case 201, and the printed circuit board 202. may be disposed in the space between the lower case 203 and the upper case 201. The upper case 201 and the lower case 203 may be coupled using screws, but are not limited thereto, and other fastening means may be provided.

The lower case 203 may he provided with a plurality of fixing parts 205 so that the heat dissipation duct 200 may be disposed at the upper portion of the cabinet 10. In the case of an embodiment of the disclosure, four of the fixing parts 205 may be provided such that one fixing part corresponds to each of the front plate 13 and the rear plate 11 of the cabinet 10 and two fixing parts corresponds to the right plate 15. However, the disclosure is not limited thereto, and a different number of the fixing parts 205 may be provided and may correspond to the other surface of the cabinet 10. Each of the fixing parts 205 may be fastened with screws to be coupled to the front plate 13, the rear plate 11, and the right plate 15.

In the case of an embodiment of the disclosure, the heat dissipation duct 200 may be disposed at an upper right portion of the cabinet 10 and the drain container 110 may be disposed at an upper left portion of the cabinet 10. Accordingly, the heat dissipation duct 200 and the drain container 110 may be disposed in the space between the drum 20 and the cabinet 10, which is formed above the drum 20. However, the disclosure is not limited thereto.

As described above, the printed circuit board 202 may be coupled to the upper case 201, the upper case 201 may be coupled to the lower case 203, and the lower case 203 may be fixed to the cabinet 10. Therefore, by separating the fixing parts 205 of the lower case 203 from the cabinet 10, the heat dissipation duct 200 including the printed circuit board 202 may be easily separated from the cabinet 10, and the printed circuit board 202 may be easily repaired or replaced.

A lower surface of the lower case 203 may have a shape of partially protruding convexly toward the printed circuit board 202.

Specifically, the lower surface of the lower case 203 may include an inlet portion 203a forming a portion of the inlet 206, an outlet portion 203b forming a portion of the outlet 207, and an airflow guide portion 203c provided between the inlet portion 203a and the outlet portion 203b. The inlet portion 203a, the outlet portion 203b, and the airflow guide portion 203c may be formed integrally as a plate shape.

The airflow guide portion 203c may correspond to a portion protruding convexly toward the printed circuit board 202 from the lower surface of the lower case 203. Accordingly, the airflow guide portion 203c may be located closest to the printed circuit board 202 among the inlet portion 203a, the outlet portion 203b, and the airflow guide portion 203c. The inlet portion 203a and the outlet portion 203b may be located at the same height, but are not limited thereto, and a height difference between the positions of the inlet portion 203a and the outlet portion 203b may exist.

The airflow guide portion 203c may be located at a position corresponding to the printed circuit board 202. Accordingly, by the airflow guide portion 203c, a portion of the heat dissipation passage 230 in which the printed circuit board 202 is disposed may have a smaller cross-sectional area than other portions of the heat dissipation passage 230. In other words, a separation distance between the upper case 201 and the lower case 203 may be the smallest at the position where the airflow guide portion 203c is formed.

The airflow guide portion 203c may include inclined portions 203d connected to one end of the outlet portion 203b and one end of the inlet portion 203a, respectively, and the airflow guide portion 203c may form the lower surface of the lower case 203 by the inclined portions 203d connected to the inlet portion 203a and the outlet portion 203b. The airflow guide portion 203c, the inlet portion 203a, the outlet portion 203b, and the inclined portions 203d may be integrally formed. The airflow guide portion 203c is disposed close to the printed circuit board 202 on which the plurality of electronic components is mounted, but may not be in contact with the printed circuit board 202 on which the plurality of electronic components is mounted.

The clothes dryer 1 may include a fire protection plate 220 provided inside the heat dissipation duct 200, and the fire protection plate 220 may be disposed between the lower case 203 and the printed circuit board 202 on which the plurality of electronic components is mounted. Specifically, the fire protection plate 220 may be disposed between the airflow guide portion 203c and the printed circuit board 202.

The heat dissipation duct 200 provided with the airflow guide portion 203c is configured to have a cross-sectional area of a portion of the heat dissipation passage 230 in which the printed circuit board 202 is disposed is smaller than that of the other portion of the heat dissipation passage 230, so that air may intensively flow through the electronic components that generate heat. Accordingly, the heat dissipation duct 200 may more effectively dissipate heat generated from the printed circuit board 202. One of the printed circuit board 202 may mount more components than in a case where the heat dissipation duct 200 is not provided.

Also, the lower case 203 and the fire protection plate 220 may protect the electronic components mounted on the printed circuit board 202 from the influence of heat generated from the drum 20, the heat exchangers 71 and 72, and the like, prevent flames from spreading to the printed circuit board 202 when a fire occurs, and prevent the electronic components from melting and falling toward the lower portion of the cabinet 10 so that the drum 20 and other devices are not contaminated by the melted electronic components.

As is apparent from the above, a clothes dryer according to an embodiment of the disclosure can efficiently dissipate heat generated from a printed circuit board by including a heat dissipation duct.

Further, the clothes dryer according to an embodiment of the disclosure can easily separate the heat dissipation duct in which the printed circuit board is provided, so that the printed circuit board can be easily repaired or replaced.

Further, the clothes dryer according to an embodiment of the disclosure can protect the printed circuit board from the influence of heat generated from a heating element such as a drum by covering the printed circuit board with the heat dissipation duct.

While the disclosure has been particularly described with reference to exemplary embodiments, it should be understood by those of skilled in the art that various changes in form and details may be made without departing from the spirit and scope of the disclosure.

What is claimed is:

1. A clothes dryer comprising:
   a cabinet having a clothes inlet;
   a drum rotatably provided in the cabinet;
   a drying fan configured to circulate air supplied to the drum; and
   a heat dissipation duct comprising:
      a lower case fixed to the cabinet and provided with an airflow guide portion protruding toward a printed circuit board on which a plurality of electronic components is mounted, and
      an upper case coupled to an upper portion of the lower case and to which the printed circuit board is fixed.

2. The clothes dryer according to claim wherein the printed circuit board is fixed to the upper case such that the electronic components face the lower case.

3. The clothes dryer according o claim 2, wherein:
   the heat dissipation duct comprises a heat dissipation passage formed between the lower case and the upper case, and
   the printed circuit board is fixed to a lower surface of the upper case such that the printed circuit board is disposed on the heat dissipation passage.

4. The clothes dryer according to claim 3, wherein the heat dissipation duct further comprises a cooling fan coupled to the upper case to form an airflow in the heat dissipation passage.

5. The clothes dryer according to claim 4, wherein:
   the heat dissipation duct is provided with an inlet through which air is introduced into the heat dissipation passage and an outlet through which air is discharged from the heat dissipation passage, and the cooling fan is disposed such that one side thereof is be in communication with the inlet.

6. The clothes dryer according to claim 5, wherein the heat dissipation duct is coupled to the cabinet such that the inlet faces a front side of the cabinet and the outlet faces a rear side of the cabinet.

7. The clothes dryer according to claim 5, wherein:
the lower case comprises an inlet portion forming the inlet and an outlet portion forming the outlet,
the airflow guide portion is provided between the inlet portion and the outlet portion,
the airflow guide portion is located closest to the printed circuit board among the airflow guide portion, the outlet portion, and the inlet portion, and
the airflow guide portion comprises a first inclined portion connected to one end of the outlet portion and a second inclined portion connected to one end of the inlet portion.

8. The clothes dryer according to claim 1, further comprising:
a driving device configured to drive the drum and the drying fan; and
a compressor,
wherein the printed circuit board comprises a driving device controller configured to control the driving device and a compressor controller configured to control the compressor.

9. The clothes dryer according to claim 8, wherein the driving device controller and the compressor controller each comprise an inverter circuit.

10. The clothes dryer according to claim 8, wherein:
the driving device controller and the compressor controller each comprise a heat sink configured to dissipate generated heat, and
one surface of the lower case protrudes convexly toward the heat sinks.

11. The clothes dryer according to claim 10, wherein:
the heat dissipation duct is provided with an inlet through which air is introduced therein and an outlet through which air is discharged therefrom,
the driving device controller comprises a first heat sink,
the compressor controller comprises a second heat sink, and
a heat sink having a higher amount of heat among the first heat sink and the second heat sink is disposed closer to the inlet than the other heat sink of the first heat sink and the second heat sink.

12. The clothes dryer according to claim 11, wherein:
the heat dissipation duct further comprises a cooling fan provided in communication with the inlet, and
the cooling fan forms an airflow to flow air from the inlet to the outlet and the airflow passes through the first heat sink and the second heat sink.

13. The clothes dryer according to claim 8, wherein:
the driving device and the compressor are disposed at a lower portion of the cabinet, and
the heat dissipation duct is disposed at an upper portion of the cabinet.

14. The clothes dryer according o claim 13, wherein:
the lower case comprises a plurality of fixing parts fixed to the cabinet, and
the heat dissipation duct is coupled to a front surface, a rear surface, and one side surface of the cabinet by the plurality of fixing parts.

15. The clothes dryer according to claim 1, further comprising a fire protection plate provided between the lower case and the printed circuit board.

16. A clothes dryer comprising:
a cabinet having a clothes inlet;
a drum rotatably provided in the cabinet;
a drying fan configured to circulate air supplied to the drum;
a driving device configured to drive the drum and the drying fan;
a compressor disposed in the cabinet;
a printed circuit board having one surface on which a driving device controller configured to control the driving device and a compressor controller configured to control the compressor are disposed; and
a heat dissipation duct provided to dissipate heat generated from the printed circuit board,
wherein the printed circuit board is disposed inside the heat dissipation duct such that the one surface on which the driving device controller and the compressor controller are disposed faces a lower surface of the cabinet.

17. The clothes dryer according to claim 16, wherein:
the heat dissipation duct comprises:
a cooling fan,
an inlet through which air is introduced into the heat dissipation duct, and
an outlet through which air is discharged from the inside of the heat dissipation duct to the outside, and
the heat dissipation duct is disposed inside the cabinet such that the inlet faces a front side of the cabinet and the outlet faces a rear side of the cabinet.

18. The clothes dryer according to claim 16, wherein the heat dissipation duct comprises an upper case to which the printed circuit board is fixed and a lower case coupled to the upper case to cover the printed circuit board, and one surface of the lower case protrudes convexly toward the printed circuit board.

19. The clothes dryer according to claim 18, wherein the lower case comprises:
an inlet portion forming an inlet;
an outlet portion forming an outlet; and
an airflow guide portion provided between the inlet portion and the outlet portion.

20. The clothes dryer according to claim 19, wherein:
the airflow guide portion is located closest to the printed circuit board among the airflow guide portion, the outlet portion, and the inlet portion, and
the airflow guide portion comprises a first inclined portion connected to one end of the outlet portion and a second inclined portion connected to one end of the inlet portion.

* * * * *